United States Patent [19]

Nishizawa et al.

[11] Patent Number: 4,870,469

[45] Date of Patent: Sep. 26, 1989

[54] TUNNEL INJECTION TYPE STATIC TRANSISTOR AND ITS INTEGRATED CIRCUIT

[75] Inventors: Junichi Nishizawa, 6-16, Komegafukuro 1-chome; Kaoru Motoya, 1-9-406 Komegafukuro 2-chome, both of Sendai-shi, Miyagi-ken, Japan

[73] Assignees: Research Development Corp.; Junichi Nishizawa; Kaoru Motoya, all of Japan

[21] Appl. No.: 147,656

[22] Filed: Jan. 25, 1988

Related U.S. Application Data

[63] Continuation of Ser. No. 762,619, Aug. 5, 1985, abandoned.

[30] Foreign Application Priority Data

Aug. 8, 1984 [JP] Japan ................................. 59-164824
Aug. 31, 1984 [JP] Japan ................................. 59-180447

[51] Int. Cl.[4] ............................................. H01L 29/80
[52] U.S. Cl. ......................................... 357/22; 357/12; 357/23.15
[58] Field of Search ................... 357/4, 12, 16, 22 A, 357/22 E, 22 F, 22 I, 23.15, 2, 3

[56] References Cited

U.S. PATENT DOCUMENTS

| | | | |
|---|---|---|---|
| 3,462,700 | 8/1969 | Berglund et al. | 357/23.15 X |
| 4,075,652 | 2/1978 | Umebachi et al. | 357/22 A |
| 4,131,902 | 12/1978 | Kub | 357/23.15 X |
| 4,160,261 | 7/1979 | Casey, Jr. et al. | 357/16 X |
| 4,366,493 | 12/1982 | Braslau et al. | 357/4 |
| 4,379,005 | 4/1983 | Hovel et al. | 357/22 A X |
| 4,466,173 | 8/1984 | Baliga | 357/89 X |
| 4,470,059 | 9/1984 | Nishizawa et al. | 357/23.4 X |
| 4,484,207 | 11/1984 | Nishizawa et al. | 357/16 |
| 4,583,105 | 4/1986 | Rosenberg | 357/23.12 |
| 4,586,240 | 5/1986 | Blackstone et al. | 357/23.4 |
| 4,639,753 | 1/1987 | Yamada | 357/22 C |
| 4,712,122 | 12/1987 | Nishizawa et al. | 357/22 |

FOREIGN PATENT DOCUMENTS

| | | | |
|---|---|---|---|
| 52-36984 | 3/1977 | Japan | 357/22 E |
| 53-96842 | 2/1980 | Japan | 357/22 E |
| 57-75464 | 5/1982 | Japan | 357/12 |
| 58-188167 | 11/1983 | Japan | 357/22 E |
| 2071912 | 9/1981 | United Kingdom | 357/22 E |

OTHER PUBLICATIONS

Sze, S. M., *Physics of Semiconductor Devices*, 2nd ed., John Wiley & Sons, Inc., 1981, pp. 77-79, 350-351.
Carr, W. N., and Mize, J. P., *MOS/LSI Design and Application*, McGraw-Hill, 1972, p. 63.
Casey, Jr., and Panish, M. B., *Heterostructure Lasers*, Academic Press, 1978, pp. 15-41.
Bozler, C. O., and Alley, G. D., "Fabrication and Simulation of the Permeable Base Transistor", IEEE Trans. on Electron Devices, vol. ED-27, No. 6, Jun. 1980, pp. 1128-1141.

*Primary Examiner*—Andrew J. James
*Assistant Examiner*—Sara W. Crane
*Attorney, Agent, or Firm*—Darby & Darby

[57] ABSTRACT

In a static induction transistor of tunnel injection type, a tunnel injection region is formed between its source region and channel region, and its gate region is formed of a semiconductor having a forbidden band larger than that of said channel region and contacting partially or wholly with the surface of said channel region. Such a transistor is also applied to an integrated circuit.

38 Claims, 5 Drawing Sheets

TUNNEL INJECTION TYPE STATIC TRANSISTOR AND ITS INTEGRATED CIRCUIT

This is a continuation of application Ser. No. 762,619, filed Aug. 5, 1985.

FIELD OF THE INVENTION

This invention relates to a static induction transistor (abbreviated hereinafter as an SIT) and an integrated circuit of such a transistor. More particularly, this invention relates to a tunnel injection type SIT employing a tunneling injection as a quantum effect to obtain a higher operating speed of the SIT, and relates also to an integrated circuit of such a transistor.

DESCRIPTION OF THE PRIOR ART

An SIT is a transistor in which the level of the potential barrier height established by a depletion layer extending between gate regions is changed to control current flowing between a source region and a drain region. In such a transistor, the potential is controlled through the electrostatic capacitance of the depletion layer. Therefore, the SIT is equivalent to a bipolar transistor from which the storage capacitance of its base layer is eliminated. Thus, the SIT is excellent over an FET (a field effect transistor) in that it operates at a very higher speed with lower noise.

However, a prior art SIT, in which the distance between the source and the drain regions, and that between the source and the gate regions are considerably large, has had such a disadvantage that carriers tend to be scattered by crystal lattices resulting in a limited cut-off frequency.

Thus, to obviate the prior art disadvantage described above, a thermionic emission type SIT in which carriers can drift at the thermionic velocity without being scattered by the crystal lattices has been proposed by the inventors of this invention and others.

In the thermionic emission type SIT, the distance between the source and the gate regions is arranged less than the mean free ath of the carriers so as to make the SIT in thermionic emission structure.

The current density J in such a thermionic emission type SIT is given by the following equation (1):

$$J = qn_s \sqrt{\frac{kT}{2\pi m^*}} \exp\left(-\frac{q(\phi_{gs} - \eta V_g)}{kT}\right) \quad (1)$$

where q is the unit charge, k is the Boltzmann's constant, T is the absolute temperature, m* is the effective mass of the carriers, $n_s$ is the impurity concentration of the source region, $\phi_{gs}$ is the diffusion potential between the gate region and the source region, and Vg is the potential applied to the gate region, respectively.

The cut-off frequency $f_c$ of the SIT when the carriers are now injected in a thermionic emission mode is given by the following equation (2) in which the second-stage input capacitance when the SIT is connected in cascade with another SIT is taken into consideration:

$$f_c \approx \frac{\sqrt{\frac{kT}{2\pi m^*}}}{8.8 \, Wg} \quad (2)$$

where Wg is the width of the potential barrier in the gate region.

Therefore, the cut-off frequency $f_c$ of the SIT is about 780 GHz when GaAs is used as the semiconductor material and the width Wg of the potential barrier in the gate region is 0.1 μm.

Thus, by making the SIT in thermionic emission structure, a higher operating speed of the SIT compared with the conventional one has been attained. However, the cut-off frequency has not been raised higher than 800 GHz.

Furthermore, since the connections of sources, gates and drains in the conventional semiconductor integrated circuit are complicated generally, a substantial space is needed for the connections so that the high density integration has heretofore been difficult.

SUMMARY OF THE INVENTION

With a view to obviate the prior art disadvantage described above, it is a primary object of the present invention to provide a tunnel injection type SIT in which the cut-off frequency higher than that of the thermionic emission type SIT is attainable.

In accordance with one aspect of the present invention which attains the above object, there is provided a tunnel injection type SIT comprising a channel region, a source region and a drain region formed respectively in connection with the surfaces of said channel region, a tunnel injection region formed between said source and channel regions, and a gate region of a semiconductor having a forbidden band gap larger than that of said channel region, said gate region being formed in contact partially or wholly with the surfaces of the channel region.

According to the first feature described above, the cut-off frequency in such an SIT is enhanced even a hundred times of that attained in the thermionic emission type SIT.

In addition to the first feature, it is a second feature of the present invention that, in such an SIT, the width of the channel region is selected to be smaller than $2\lambda_D$, where $\lambda_D$ is the Debye length determined by the impurity concentration of the channel region.

According to this second feature, the capacitance Cgs between the gate and the source is reduced along with the gate resistance rg so that a higher operating speed may be attained.

In addition to the first feature, it is a third feature of the present invention that, in such an SIT, the composition of the semiconductor forming the gate region is modified so as to attain coincidence between the semiconductor lattice constant of the gate region and that of the channel region.

According to this third feature, the surface level at the boundary surface of the gate region decreases to improve the source-gate breakdown voltage characteristic so that the leakage current can be decreased to reduce the power consumption.

In accordance with another aspect of the present invention, there is provided a semiconductor integrated circuit comprising a tunnel injection type SIT incorporated therein the transistor comprising a channel region, a source region having a tunnel injection region and a drain region formed respectively in contact with both sides of said channel region, and a gate region formed partially in contact with said channel region, there being connected an output terminal, an earth terminal, and an output terminal and also a power terminal through a resistor respectively to the gate, the source, and the drain regions.

According to this fourth feature described above, a tunnel injection type SIT of vertical structure is incorporated in an integrated circuit. Therefore, the required wiring is facilitated, and the area required for wiring connections can be reduced to about ⅔ of the prior art value, thereby ensuring integration with a high packaging density so that a semiconductor integrated circuit of high operating speed, low power consumption and low noise, and further ensuring the operation at the room temperature is provided.

Other objects and features of the present invention will become apparent from the following detailed description taken in conjunction with the accompanying drawings.

DESCRIPTION OF THE PREFERRED EMBODIMENTS

Figure 1:
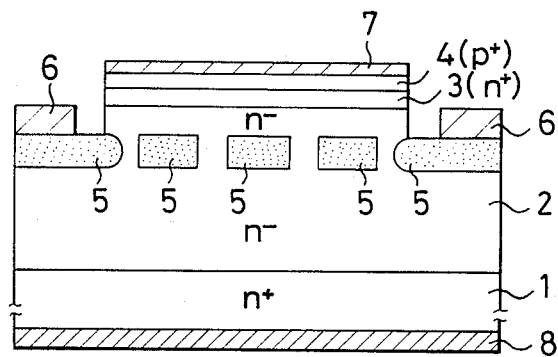
FIGS. 1 to 9 are schematic sectional views showing various embodiments respectively of the tunnel injection type SIT according to the present invention.

FIG. 1 shows the structure of a tunnel injection type SIT according to the present invention in which a drain region 1 is formed by an n+ layer of GaAs substrate. On the substrate, there are formed a channel region 2 of an n− layer, an n+ layer 3 and a source region 4 of a p+ layer respectively in strata. The n+ layer 3 and the source region 4 of the p+ layer constitute a tunnel junction. A buried layer of $Ga_{(1-x)}Al_xAs$ is provided in the channel region 2 to form a gate region 5. Although the gate region 5 is shown in section only in FIG. 1, it is formed in a reticulate or linear pattern, and the illustrated portions are combined at their ends to be exposed to the surface. A gate electrode 6 is formed on the exposed portions of the gate region 5. A source electrode 7 and a drain electrode 8 are formed on the upper surface of the source region 4 and on the lower surface of the drain region 1, respectively.

In the case of a compound semiconductor such as GaAs, a satisfactory electrical insulating film cannot be formed thereon. However, when a mixed crystal such as, for example, $Ga_{(1-x)}Al_xAs$ whose forbidden band gap is larger than that of GaAs is used to form the gate region 5 as described above, the gate region can provide an electrical insulation similar to that provided by an $SiO_2$ film or the like.

In the channel region Z defined between the source region 4 and the drain region 1 with the gate region 5 being formed therein in the transistor structure shown in FIG. 1, the distance from the source region 4 to the intrinsic gate region 5 is selected to be less than the mean free path of carriers. Then, the transistor thus obtained can operate as a normally-on type or a normally-off type by suitably selecting the distance between and the thickness of the portions of the gate region 5 and also by suitably changing the impurity concentration of the channel region 2. The value of x in $Ga_{(1-x)}Al_xAs$ providing the gate region 4 is, for example, x=0.3. The mixed crystal is preferably undoped to such an impurity concentration that injection of carriers from the gate toward the channel region may not occur. As used hereafter, the term "undoped" will be understood to have this meaning.

The cut-off frequency $f_c$ of the tunnel injection type SIT constructed such as described above is given by the following equation (3):

$$f_c = \frac{Gm}{2\pi Cg} = \frac{\frac{i}{Vg}}{2\pi Cg} = \frac{\frac{Q}{\tau}}{2\pi CgVg} \quad (3)$$

where Gm denotes the mutual conductance, and $$Q = C_g V_g \quad (4)$$

Combining equations (3) and (4) leads to $$f_c = \frac{1}{2\pi\tau} = \frac{f_t}{2\pi} \quad (5)$$

where the tunneling transition time $f_t$ is the reciprocal of $\tau$. It ia given by the following equation (6):

$$\tau = \frac{\hbar}{qEa} \quad (6)$$

where $\hbar$ is the Planck's constant divided by $2\pi$ ($\hbar=1.0546\times 10^{-34}$ J.sec), E is the field strength of the tunnel junction, and a is the lattice constant, respectively. If the value of the lattice constant is assumed to be 5.6533 Å of GaAs, then, according to the equations (5) and (6), the cut-off frequency $f_c$ is $1.37\times 10^{13}$ Hz, $6.83\times 10^{13}$ Hz, $9.56\times 10^{13}$ Hz and $1.37\times 10^{14}$ Hz that is order of 100 THz when the field strength E is $10^6$ V/cm, $5\times 10^6$ V/cm, $7\times 10^6$ V/cm and $10^7$ V/cm, respectively. This value of the cut-off frequency is about a hundred times of that attained in the thermionic emission type SIT which has been proposed by the present applicants. Thus, it will be understood that the cut-off frequency $f_c$ of the SIT can be enhanced largely by utilizing the tunnel injection based on the quantum effect rather than the thermionic injection.

In the embodiment shown in FIG. 1, the gate-source capacitance Cgs and the gate-drain capacitance Cgd tend to become large.

Figure 2:
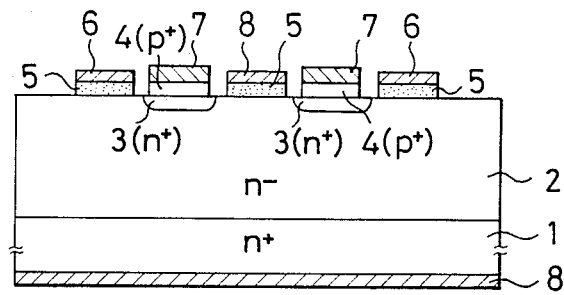

Such a problem is solved by another embodiment of the present invention shown in FIG. 2. According to the embodiment shown in FIG. 2, the gate-source capacitance Cgs can be decreased to a very small value. In FIG. 2, the same reference numerals are used to designate the same or equivalent parts appearing in FIG. 1. It will be seen in FIG. 2 that the gate region 5 and the source region 4 are disposed on the same major surface thereby facilitating lead-out of the gate electrode 8, and both of the gate-source capacitance Cgs and the gate resistance rg are decreased. Thus, the embodiment shown in FIG. 2 is advantageous in that the SIT can operate at a higher speed.

Figure 3:
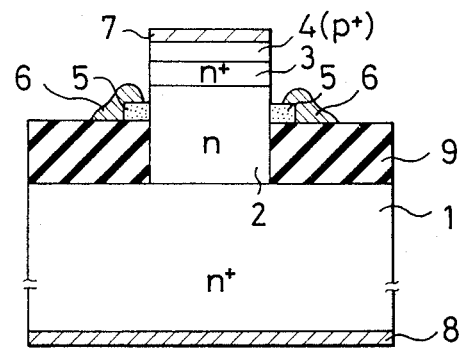
Figure 4:
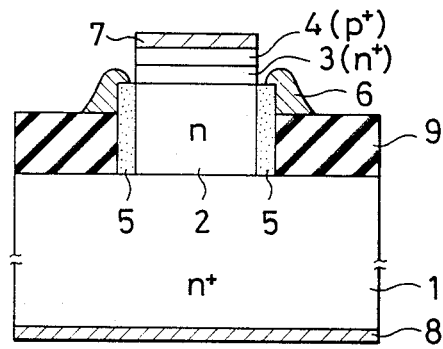

FIGS. 3 and 4 show still another embodiment of the present invention in which a layer 9 of an electrical insulator is provided to decrease the gate-drain capacitance Cgd. The electrical insulator is preferably $SiO_2$, $Si_3N_4$, a polyimide resin or the like. The dielectric constant of $Si_3N_4$ is about 5.5 that of $SiO_2$ is about 3.8 and that of the polyimide is about 3.2 in contrast to the dielectric constant, 11, of GaAs. Thus, the gate-drain capacitance Cgd is decreased to less than ½ of the value observed when GaAs, instead of the insulator, is present.

Figure 5:
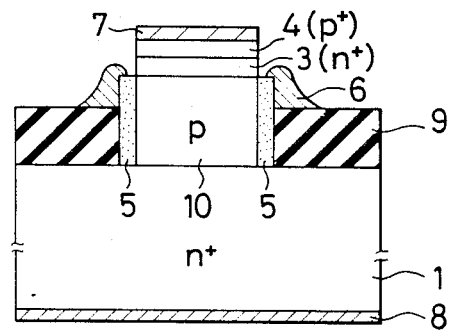

FIG. 5 shows still another embodiment of the present invention which is a partial modification of the embodiment shown in FIGS. 3 and 4. It will be seen that the $n^-$-type channel region 2 in FIGS. 3 and 4 is replaced by a p-type layer providing the channel region 10. When the gate region 5 and the p-type layer providing the channel region 10 are inverted in state, and the portion of the p-type layer in contact with the gate region 5 is turned into an n-type layer, electrons are injected by tunneling from the source region 4 into the drain region 1 to render the SIT in operation.

Although the length from the source region 4 to the drain region 1, that is, the channel length may be controlled to a value of such as 100 Å, the gate interval, that is, the channel width must be determined on the basis of the Debye length which is given by the following equation (7):

$$D = \sqrt{\frac{\epsilon kT}{nq^2}} \quad (7)$$

where n is the impurity concentration of the channel region, and $\epsilon$ is the dielectric constant, respectively.

According to the equation (7), the Debye length $\lambda_D$ is about 3.95 μm, 0.4 μm and 0.04 μm when the impurity concentration n is $10^{12}$ cm$^{-3}$, $10^{14}$ cm$^{-3}$ and $10^{16}$ cm$^{-3}$, respectively. Since the dimension control of the channel width in this case is determined, generally, by the accuracy of photolithography, it is necessary to determine the dimension of the channel width in relation to the fabrication technology.

Figure 6:
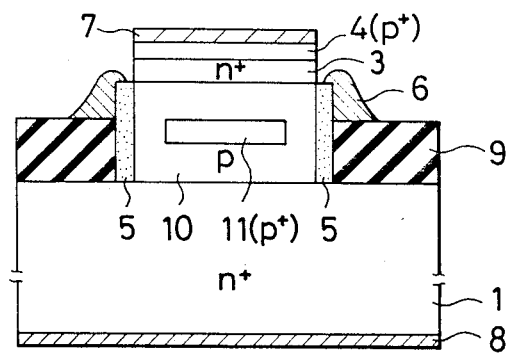

FIG. 6 shows another embodiment of the present invention which is a partial modification of the embodiment shown in FIG. 5. Referring to FIG. 6, a $p^+$-type region 11 having a high impurity concentration is formed in the p-type channel region 10 shown in FIG. 5 so that the flow of electrons injected from the source region 4 can be efficiently restricted by the gate region 5.

The buried region 11 provides a high potential barrier against the electrons injected from the source region 4. Therefore, the electrons drift through the both sides of the $p^+$-type region 11 buried in the p-type channel region 10. Since the side portion of the p-type channel region 10 in contact with the gate region 5 is the actually operating portion, the width of the source region 4 and that of the source electrode 7 may be, for example, about 0.5 μm, and this facilitates the manufacture of the SIT.

Figure 7:
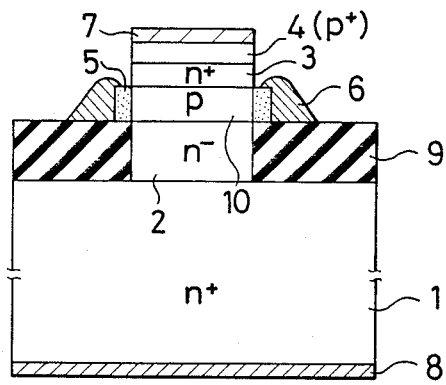

FIG. 7 shows still another embodiment of the present invention which is a partial modification of the embodiment shown in FIG. 5. Referring to FIG. 7, the p-type region 10 is replaced by the $n^-$-type region 2 except the portion making contact with the gate region 5.

Figure 8:
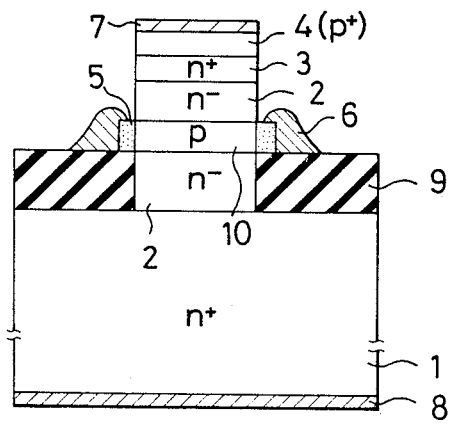

FIG. 8 is a partial modification of the embodiment shown in FIG. 7. Referring to FIG. 8, the p-type region 10 is inserted in the $n^-$-type channel region 2 so as to decrease the gate-source capacitance Cgs and, also, to decrease the height of the gate region 5.

In all of the embodiments described with reference to FIGS. 1 to 8, the distance from the source region to the intrinsic gate region is, of course, selected to be less than the mean free path of carriers.

The impurity concentration in the $n^+$-type and $p^+$-type layers of the tunnel junction layer can be determined as follows. That is, if the impurity concentration in the $n^+$-type and $p^+$-type layers is uniform, the thickness W of the depletion layer is determined by the diffusion potential at zero bias and expressed as follows:

$$W = \sqrt{\frac{2\epsilon s}{q}\left(\frac{1}{N_A} + \frac{1}{N_D}\right)V_b} \quad (8)$$

$$E = \frac{2V_b}{W} \quad (9)$$

where $N_A$ and $N_D$ denotes the acceptor density in the $p^+$-type region 4 and the doner density in the $n^+$-type region 3, respectively.

If $N_A$ is $10^{21}$ cm$^{-3}$, the values of W, E and the cut-off frequency $f_c$ are 130 Å, $2.16\times10^6$ V/cm and 40 THz for $N_D$ of $10^{19}$ cm$^{-3}$, and 41 Å, $6.8\times10^6$ V/cm and 72 THz for $N_D$ of $10^{20}$ cm$^{-3}$, respectively.

Figure 9:
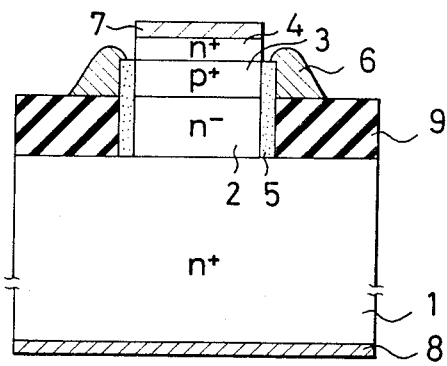

Although the source region is formed of the $p^+$-type layer 4 in the tunnel injection region of the $p^+$-type and $n^+$-type layers in all of the embodiment described above, the source region may also be formed of the $n^+$-type layer as shown in FIG. 9.

The surface level of $Ga_{(1-x)}Al_xAs$ providing the gate region is required to be as low as possible relative to that of GaAs. For this purpose, a mixed crystal, such as, $Ga_{(1-x)}Al_xAs(1-y)P_y$ which is obtained by doping a small quantity of phosphorus (P) into $Ga_{(1-x)}Al_xAs$, is preferably used, so that its lattice constant can be matched sufficiently with that of GaAs. The composition of $Ga_{(1-x)}Al_xAs_{(1-y)}P_y$ is preferably such that y is about 0.01 when x=0.3. By so attaining the coincidence between the semiconductor lattice constant of the gate region and that of the channel region, the source-gate breakdown voltage characteristic can be improved to decrease the leakage current and to reduce the power consumption.

Preferably, the impurity concentration of the channel region is selected for the i layer to be about $10^{19}$ cm$^{-3}$, and that of the tunnel injection region is selected to be about $10^{19}$–$10^{21}$ cm$^3$.

As the electrode materials of the source and the drain, alloys such as Au-Ge and Au-Ge-Ni are available for the $n^+$-type layer, and Au-Zn, Ag-Zn and Cr-Au for the $p^+$-type layer.

As the electrode materials for the gate region of $Ga_{(1-x)}Al_xAs$, metallic materials of high melting point such as Ti, Pt, W, Cr, Hf and Ni which do not make ohmic contact with $Ga_{(1-x)}Al_xAs$ may be available.

Integrated circuit including the tunnel injection type SIT according to the present invention will now be described hereinafter.

The tunnel injection is characterized in that it has relatively low noise and, since there may be produced rather large current by a small voltage, the mutual conductance Gm can easily be increased and the current drive ability is high. Further, since the tunnel injection tends to occur more easily at a raised temperature, it does not need to cool the SIT. Thus, it will be understood that the tunnel injection type SIT is highly suitable for the construction of the integrated circuit.

Figure 10:
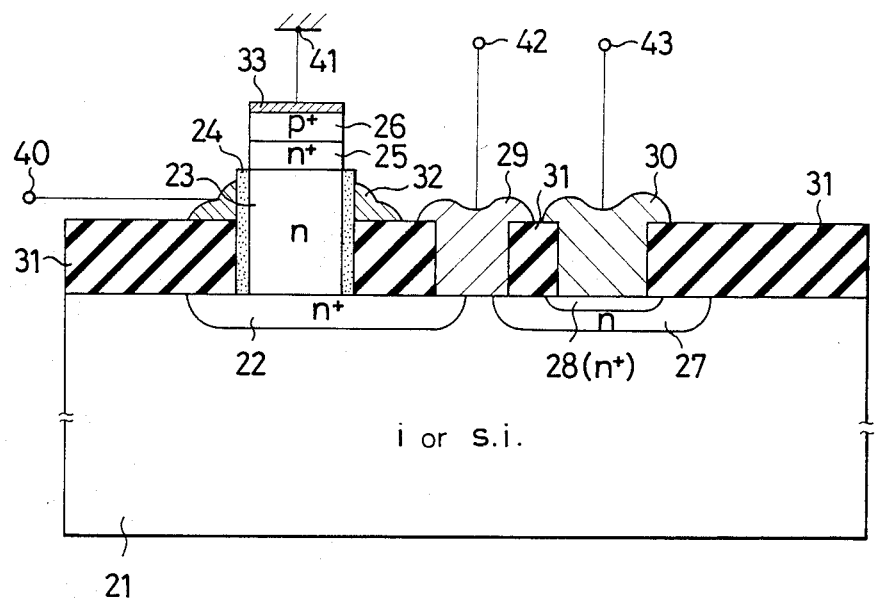
FIG. 10 is a schematic sectional view showing an embodiment of the semiconductor integrated circuit according to the present invention.

FIG. 10 shows an embodiment of the integrated circuit according to the present invention. Referring to FIG. 10, a substrate 21 of GaAs, which is an intrinsic semiconductor i or a semi-insulating semiconductor s.i., is prepared, and an n+-type buried layer providing a drain region 22 is formed in one of the major surfaces of the substrate 21. A channel region 23 is formed on the drain region 22. A hetero-junction gate region 24 is formed in contact with the side surface of the channel region 23. The gate region 24 is provided by a compound semiconductor, such as $Ga_{(1-x)}Al_xAs_{(1-y)}P_y$ whose forbidden band gap is larger than that of GaAs providing the substrate 21. An n+-type region 25 constituting the tunnel injection layer is formed on the channel region 23, and a source region 26 of p+-type constituting the tunnel injection layer is formed on the n+-type region 25. On the other hand, an n-type layer providing a resistance region 27 is formed in the major surface of the substrate 21 of GaAs in proximity to the drain region 22, and an n+-type layer providing an electrode region 28 is formed in the resistance region 27. An output electrode 29 is provided lo cover part of the drain region 22 and the resistance region 27, and a power supply electrode 30 is provided on the electrode region 28. The remaining area of the major surface of the substrate 21 of GaAs is covered with a film of an electrical insulator 31 such as $Si_3N_4$, $SiO_2$ or a polyimide resin. A gate electrode 32 is formed on the gate region 24 protruding upward through the insulator film 31, and a source electrode 33 is formed on the source region 26. An input terminal 40, a grounding terminal 41, an output terminal 42 and a power supply terminal 43 are connected to the gate electrode 32, source electrode 33, output electrode 29 and power supply electrode 30 respectively to form an integrated circuit.

Formation of the tunnel injection type SIT of the vertical structure on the substrate 21 of GaAs in the manner described above facilitates wiring connections to the drain region 22, gate region 24 and source region 26.

Figure 11:
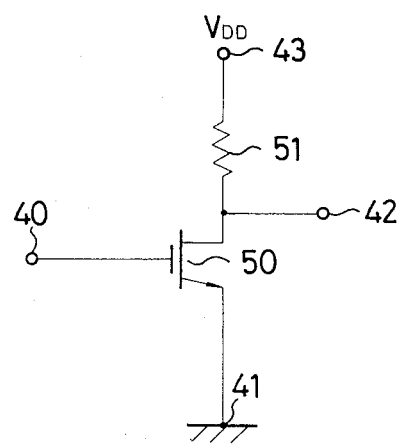
FIG. 11 is an equivalent circuit diagram of the integrated circuit shown in FIG. 10.

FIG. 11 shows an equivalent circuit of FIG. 10 and, in FIG. 11, the same reference numerals are used to designate the same parts appearing in FIG. 10. It will be seen that a load resistor 51 is connected to a tunnel injection type SIT 50 of normally-off characteristic shown in FIG. 11. When an input signal of low level is applied to the input terminal 40 in the state in which the power supply voltage $V_{DD}$ is applied to the power supply terminal 43, the tunnel injection type SIT 50 remains in its off state, and an output signal of high level appears at the output terminal 42. On the other hand, when an input signal of high level is applied to the input terminal 40, the tunnel injection type SIT 50 is turned on, and an output signal of low level appears at the output terminal 42. Thus, the SIT 50 makes the so-called inverter action. In the circuit shown in FIG. 11, since the resistance of the tunnel injection type SIT is small, the value of the current is determined nearly by the value of the load resistor 51. For example, when the load resistor 51 has a resistance value of 100 k$\Omega$, and $V_{DD}$ is 0.1 volt, the current value is about 1 $\mu$A.

Figure 12:
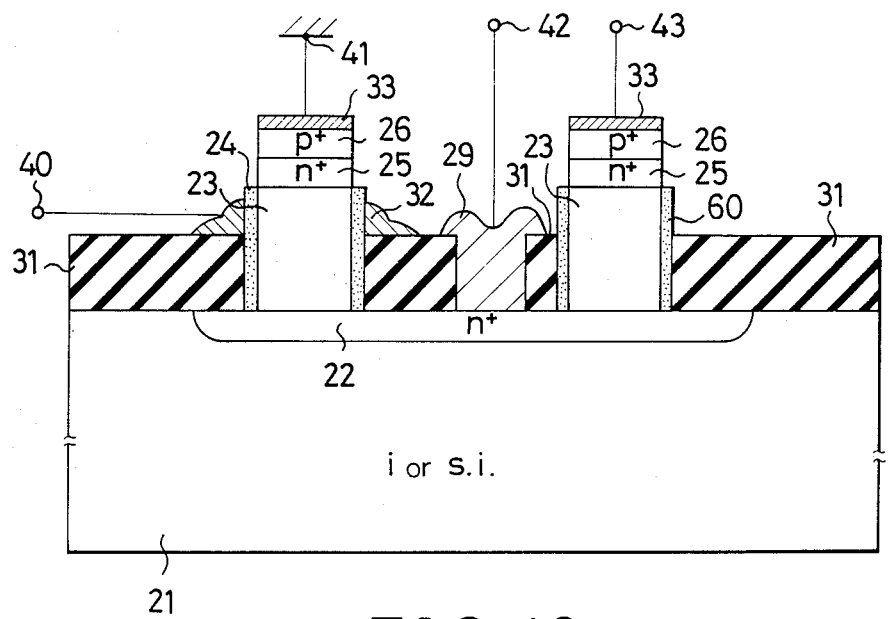
FIG. 12 is a schematic sectional view showing another embodiment of the semiconductor integrated circuit according to the present invention.

FIG. 12 shows another embodiment of the integrated circuit according to the present invention in which a tunnel injection type SIT of the depletion mode provides a load resistor. In FIG. 12, the transistor acting as the load includes a gate region 60 having a thickness smaller than that of the normally-off transistor, so that the transistor makes a normally-on operation to function as the resistor. Thus, in the structure shown in FIG. 12, there is no need for separately providing the resistor to cause the inverter action of another SIT.

The gate region 60 may be in direct contact with the n+-type layers of the source region 25 and the drain region 22, respectively.

The load transistor may be a thermionic emission type SIT, a conventional SIT or FET or the like, besides the tunnel injection type SIT.

Figure 13:
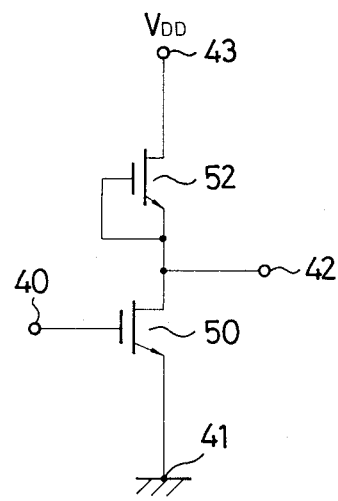
FIG. 13 is an equivalent circuit diagram of the integrated circuit shown in FIG. 12.

FIG. 13 shows an equivalent circuit of FIG. 12. It will be seen that a normally-on type transistor 52 acting as an impedance element is connected to the tunnel injection type SIT 50 to constitute an inverter circuit. The operation of this inverter circuit is similar to that of the circuit shown in FIG. 11, and, therefore, detailed description will not be repeated. Although the gate structure of the hetero-junction type is shown in the aforementioned embodiments of the present invention, of course, it may be replaced by an insulated gate, a Schottky gate or a pn junction gate.

In the embodiment of the integrated circuit, formation of the tunnel injection type SIT of the vertical structure facilitates making the channel length smaller than 1000 Å, and also facilitates wiring to the source and drain formed on the channel so that the integrated circuit can be produced more easily than an integrated circuit of an FET or an HEMT where fine wiring to its source, gates and drain are required. Therefore, the area required for wiring can be reduced to about ⅔ of the prior art one so that a high packing density can be attained.

In the aforementioned embodiments of the present invention, the known technique of, for example, double-layer interconnections can be used for connection of the integrated circuit to the power source, ground and input and output terminals through a planar structure and an insulator. The material is in no way limited to GaAs and may be Si, InP, InAs, InSb or a II-V compound semiconductor. It is apparent that the material can also be provided by, for example, the combination of HgTe or CdTe with $Hg_{(1-x)}Cd_{(x)}Te$.

Further, the tunnel injection type SIT and its integrated circuit embodying the present invention can be formed by a molecular or photo exited molecular epitaxial growth process, which was invented by the one of the inventors and in which molecular layers of GaAs can be formed one after another in the epitaxial growth process. Similarly, the integrated circuit can be formed by a vapor phase epitaxy, a liquid phase epitaxy, an MO-CVD method, an MBE process, an ion implantation or diffusion process, a photolithography, plasma etching, a chemical etching, or any one of combinations of various vacuum evaporation processes.

What is claimed is:

1. A static induction transistor of tunnel injection type and having an intrinsic gate, comprising: a semiconductor channel region including a first portion having a high impurity concentration of a first conductivity type and a second portion of a low impurity concentration; a semiconductor source region having a high impurity concentration of a second conductivity type opposite to said first conductivity type and being formed adjacent said first portion to define a tunnel junction therewith; a semiconductor drain region formed in contact with said second portion of the channel region and being of said first conductivity type; a semiconductor gate region making contact with said second portion of the channel region and formed of an undoped semiconductor having a forbidden band gap larger than that of the semiconductor forming said second portion of the channel region, said gate region being located so that the distance from said source region to the intrinsic gate is less than the mean free path of carriers; and a gate electrode disposed on said semiconductor gate region.

2. A static induction transistor as claimed in claim 1, wherein said channel region is formed of GaAs, and said gate region is formed of $Ga_{(1-x)}Al_xAs$.

3. A static induction transistor as claimed in claim 1, wherein said second portion of the channel region has the second conductivity type and includes a semiconductor region of a higher impurity concentration providing within said drain region, a higher potential barrier against carriers drifting from said source region than the remaining portion of said second portion of the channel region.

4. A static induction transistor of tunnel injection type and having an intrinsic gate, comprising: a semiconductor channel region including a first portion having a high impurity concentration of a first conductivity type and a second portion of a low impurity concentration; a semiconductor source region having a high impurity concentration of a second conductivity type opposite to said first conductivity type and being formed adjacent said first portion, to define a tunnel junction therewith; a semiconductor drain region formed in contact with said second portion of the channel region and being of said first conductivity type; a semiconductor gate region making contact with said second portion of the channel region and formed of an undoped semiconductor having a forbidden band gap larger than that of the semiconductor forming said second portion of the channel region, said gate region being located so that the distance from said source region to the intrinsic gate is less than the means free path of carriers; and a gate electrode disposed on said semiconductor gate region; with the width of said second portion of the channel region being selected to be smaller than $2\lambda_D$, where $\lambda_D$ is the Debye length determined by the impurity concentration of said second portion of the channel region.

5. A static induction transistor as claimed in claim 4, wherein said channel region includes a semiconductor region providing a higher potential barrier against carriers drifting from said source region than the remaining portion of said channel region.

6. A static induction transistor as claimed in claim 4, wherein said channel region is formed of GaAs, and said gate region is formed of $Ga_{(1-x)}Al_xAs_{(1-y)}P_y$.

7. A static induction transistor of tunnel injection type and having an intrinsic gate, comprising: a semiconductor channel region including a first portion having a high impurity concentration of a first conductivity type and a second portion of a low impurity concentration; a semiconductor source region having a high impurity concentration of a second conductivity type opposite to said first conductivity type and being formed adjacent said first portion, to define a tunnel junction therewith; a semiconductor drain region formed in contact with said second portion of the channel region and being of said first conductivity type; a semiconductor gate region making contact with said second portion of the channel region and formed of an undoped semiconductor having a forbidden band gap larger than that of the semiconductor forming said second portion of the channel region, said gate region being located so that the distance from said source region to the intrinsic gate is less than the mean free path of carriers; and a gate electrode disposed on said semiconductor gate region; the semiconductor forming said semiconductor gate region including a component which modifies a lattice constant so as to attain coincidence between the semiconductor lattice constance of said semiconductor gate region and that of said second portion of the channel region.

8. A static induction transistor as claimed in claim 7, wherein said channel region is formed of GaAs, and said gate region is formed of $Ga_{(1-x)}Al_xAs_{(1-y)}P_y$.

9. A static induction transistor as claimed in claim 7, wherein said second portion of the channel region has the second conductivity type and includes a semiconductor region of a higher impurity concentration providing within said drain region a higher potential barrier against carriers drifting from said source region than the remaining portion of said second portion of the channel region.

10. A static induction transistor as claimed in claim 7, wherein the width of said channel region is selected to be smaller than $2\lambda_D$, where $\lambda_D$ is the Debye length determined by the impurity concentration of said channel region.

11. A semiconductor integrated circuit device comprising a static induction transition of tunnel injection type incorporated therein, said transistor having an intrinsic gate and comprising: a semiconductor channel region including a first portion having a high impurity concentration of a first conductivity type and a second portion of a low impurity concentration; a semiconductor source region having a high impurity concentration of a second conductivity type opposite to said first conductivity type and being formed adjacent said first portion, to define tunnel junction therewith; a semiconductor drain region formed in contact with said second portion of the channel region and being of said first conductivity type; a semiconductor gate region formed in contact with said second portion of the channel region and formed of an undoped semiconductor having a forbidden band gap larger that of the semiconductor forming said second portion of the channel region, said gate region being located so that the distance from said source region to the intrinsic gate is less than the mean free path of carriers; a signal input terminal, a ground terminal and an output terminal connected respectively to the gate electrode, the source region, and the drain region, the integrated circuit device further including a power supply terminal and a resistor connected between said drain region said power supply terminal.

12. A semiconductor integrated circuit as claimed in claim 11, wherein said resistor is provided by a static induction transistor of normally-on type or a static induction transistor of tunnel injection type.

13. A semiconductor integrated circuit as claimed in claim 11, wherein said channel region is formed of GaAs, and said gate region is formed of $Ga_{(1-x)}Al_xAs$ or $Ga_{(1-x)}Al_xAs_{(1-y)}P_y$.

14. A tunnel injection controlling semiconductor device of the type utilizing tunneling of charge carriers from one band to another band through a forbidden band gap, said device having an intrinsic gate and comprising:
 a highly doped source semiconductor region of a first conductivity type for supplying carriers of a second conductivity type of opposite to the first conductivity type;

a highly doped drain semiconductor region of said second conductivity type for receiving said carriers;

a channel semiconductor region of said second conductivity type disposed between said source region and said drain regions, including a highly doped region disposed adjacent to said source region and a lightly doped region disposed between said highly doped region and said drain region and having a carrier concentration lower than said high doped region; and a hetero-junction gate including a gate semiconductor region disposed on the channel region and formed of an undoped semiconductor material having a forbidden band gap larger than that of the channel region, said gate region being located so that the distance from said source region to the intrinsic gate is less than the mean free path of carriers, thereby defining a hetero-junction with the channel region, an a gate electrode provided in contact with the gate semiconductor region for controlling a tunnel current flow from said source region to said drain region.

15. A semiconductor device in accordance with claim 14, wherein the hetero-junction gate is buried in the lightly doped region of the channel region at a location close to the source region.

16. A semiconductor device in accordance with claim 14, wherein the hetero-junction is formed on said lightly doped channel region co-planar with the source region and sandwiching the source region.

17. A semiconductor device in accordance with claim 14, wherein said hetero-junction is formed on the lightly doped channel region on a side wall of the device between the source and drain regions.

18. A semiconductor device in accordance with claim 14, wherein a gate electrode provided in contact with said gate region is formed of a metal material making an ohmic contact with said gate region.

19. A semiconductor device in accordance with claim 14, wherein the width of said channel region is smaller than $2\lambda_D$, where $\lambda_D$ is the Debye length determined by the impurity concentration of said channel region.

20. A semiconductor device in accordance with claim 14, wherein said channel region is formed of GaAs, and said gate region is formed of $Ga_{(1-x)}Al_xAs$.

21. A semiconductor device in accordance with claim 14, wherein said channel is formed of GaAs, and said gate region is formed of $Ga_{(1-x)}Al_xAs_{(1-y)}P_y$.

22. A tunnel injection of controlling semiconductor device of the type utilizing tunneling of charge carriers from one band to another band through a forbidden band gap, said device having an intrinsic gate and comprising:

a highly doped source semiconductor region of a first conductivity type, for supplying carriers of a second conductivity type opposite to the first conductivity type;

a highly doped drain semiconductor region of said second conductivity type for receiving said carriers;

a channel semiconductor region disposed between said source region and said drain region, and comprising a highly doped portion of said second conductivity type disposed adjacent to said source region to form a tunnel junction and a lightly doped portion of said first conductivity type disposed between said highly doped portion and said drain region and having a side wall;

a gate structure including a gate region disposed on said side wall of the lightly doped portion and formed of an undoped semiconductor material having a larger band gap than that of the channel region, said gate region being located so that the distance from said source region to the intrinsic gate is less than the means free path of carriers, thereby defining a hetero-junction with said lightly doped portion, and a gate electrode provided in contact with said gate region.

23. A semiconductor device in accordance with claim 22, further comprising an inner highly doped region of said first conductivity type disposed at a central portion of said lightly doped region to allow a tunnel current to flow outside of said inner highly doped region.

24. A semiconductor device in accordance with claim 22, wherein the width of said lightly doped portion of the channel region is smaller than $2\lambda_D$, where $\lambda_D$ is the Debye length determined by the impurity concentration of said channel region.

25. A semiconductor device in accordance with claim 22, wherein said channel region is formed of GaAs, and said gate region is formed of $Ga_{(1-x)}Al_xAs$.

26. A semiconductor device in accordance with claim 22, wherein said channel region is formed of GaSa, and said gate region is formed of $Ga_{(1-x)}Al_xAs_{(1-y)}P_y$.

27. A tunnel injection controlling semiconductor device of the type utilizing tunneling of charge carriers from one band to another band through a forbidden band gap, said device having an intrinsic gate and comprising:

a highly doped source semiconductor region of a first conductivity type for supplying carriers of a second conductivity type opposite to said first conductivity type;

a highly doped drain semiconductor region of said second conductivity type for receiving said carriers;

a channel semiconductor region disposed between said source region and drain region, and comprising a highly doped portion of said second conductivity type disposed adjacent to said source region to form a tunnel junction, a first lightly doped portion of sad first conductivity type disposed adjacent to said highly doped portion and having a side wall and a second lightly doped portion of said second conductivity type disposed between said first lightly doped portion and said drain region; and a gate structure including a gate semiconductor region disposed on said side wall of the first lightly doped portion and formed of an undoped semiconductor material having a forbidden band gap larger than that of said first lightly doped portion of the channel region, said gate region being located so that the distance from said source region to the intrinsic gate is less than the mean free path of carriers, thereby defining a hetero-junction with the first lightly doped portion, and a gate electrode provided in contact with said gate semiconductor region for controlling a tunnel current from said region to said drain region.

28. A semiconductor device in accordance with claim 27, wherein the width of said first lightly doped portion of the channel region is smaller than $2\lambda_D$, where $\lambda_D$ is the Debye length determined by the impurity concentration of said first lightly doped portion of the channel region.

29. A semiconductor device in accordance with claim 27, wherein said channel region is formed of GaAs, and said gate region is formed of $Ga_{(1-x)}Al_xAs$.

30. A semiconductor device in accordance with claim 27, wherein said channel region is formed of GaAs, and said gate region is formed $Ga_{(1-x)}Al_xAs_{(1-y)}P_y$.

31. A tunnel injection controlling type semiconductor device, said device having an intrinsic gate and comprising:
  a highly doped source semiconductor region of a first conductivity type for supplying carriers;
  a highly doped drain semiconductor region of a second conductivity type opposite to said first conductivity type for receiving said carriers;
  a channel semiconductor region disposed between said source region and said drain region, and a comprising a highly doped portion of said second conductivity type disposed adjacent to said source region to form a tunnel junction, a first lightly doped portion of said second conductivity type disposed adjacent to said highly doped portion, a second lightly doped portion of said first conductivity type disposed adjacent to said first lightly doped portion and having a side wall, and a third lightly doped portion of said conductivity type disposed between said second lightly doped portion and said drain region; and
  a gate structure including a gate semiconductor region disposed on said side wall of the second lightly doped portion and formed of an undoped semiconductor material having a forbidden band gap larger than that of said second lightly doped portion of the channel region, said gate region being located so that the distance from said source region to the intrinsic gate is less than the mean free path of carriers, thereby defining a hetero-function with the second lightly doped portion, and a gate electrode provided in contact with said gate semiconductor region for controlling a tunnel current from said source region to said drain region.

32. A semiconductor device in accordance with claim 31, wherein the width of said second lightly doped portion of the channel region is smaller than $2\lambda_D$, where $\lambda_D$, is the Debye length determined by the impurity concentration of said second lightly doped portion of the channel region.

33. A semiconductor device in accordance with claim 31, wherein said channel region is formed of GaAs, nd said gate region is formed of $Ga_{(1-x)}Al_xAs$.

34. A semiconductor device in accordance with claim 31, wherein said channel region is formed if GaAs, and said gate region is formed of $Ga_{(1-x)}Al_xAs_{(1-y)}P_y$.

35. A semiconductor integrated circuit device formed on a semi-insulating or a highly resistive semiconductor substrate, including a tunnel injection controlling semiconductor device of the type utilizing tunneling of charge carriers from one band to another band through a forbidden band gap, said device having an intrinsic gate and comprising:
  a highly doped source semiconductor region of a first conductivity type for supplying carriers of a second conductivity type opposite to the first conductivity type;
  a highly doped drain semiconductor region of said second conductivity type for receiving said carriers;
  a channel semiconductor region having said second conductivity type disposed between said source region and said drain region, including a highly doped region disposed adjacent to said source region and a lightly doped region disposed between said highly doped region and said drain region and having a carrier concentration lower than said highly doped region; and
  a hetero-junction gate including a gate semiconductor region disposed on the channel region and formed of an undoped semiconductor material having a forbidden band gap larger than that of the channel region, said gate region being located so that the distance from said source region to the intrinsic gate is less than the mean free path of carriers, thereby defining a hetero-junction with the channel region, and a gate electrode provided in contact with the gate semiconductor region for controlling a tunnel current flow from said source region to said drain region, said hetero-junction being formed on the lightly doped channel region on a side wall of the device between the source and the drain regions;
  the semiconductor integrated circuit device further comprising a signal input terminal, a ground terminal, and an output terminal connected respectively to the gate electrode, the source region, and the drain region, a power supply terminal, and a resistor connected between the power supply terminal and a portion of said semiconductor device so as to constitute the integrated circuit.

36. A semiconductor integrated circuit device as claimed in claim 35, wherein said gate semiconductor region is formed of a semiconductor having a forbidden band gap larger than that of the semiconductor forming said channel region.

37. A semiconductor integrated circuit device as claimed in claim 35, wherein said resistor is provided by one of a static induction transistor of the normally-on type and a static induction transistor of tunnel injection type.

38. A semiconductor integrated circuit as claimed in claim 35, wherein said channel region is formed of GaAs, and said gate semiconductor region is formed of one of $Ga_{(1-x)}Al_xAs$ and $Ga_{(1-x)}Al_xAs_{(1-y)}P_y$.

* * * * *

UNITED STATES PATENT AND TRADEMARK OFFICE
CERTIFICATE OF CORRECTION

PATENT NO. : 4,870,469

DATED : September 26, 1989

INVENTOR(S) : NISHIZAWA ET AL.

It is certified that error appears in the above-identified patent and that said Letters Patent is hereby corrected as shown below:

Column 1, line 43, change "ath" to --path--.

Column 3, line 60, change "Z" to --2--.

Column 4, line 27, change "ia" to --is--.

Column 5, line 25 (in the equation), change "D" to -- $\lambda_D$ --.

Column 6, line 4, delete "layer" (second occurrence).

Column 7, line 20, change "lo" to --to--.

Column 9, line 36, change "means" to --mean--.

Column 11, line 49, after "channel" insert --region--.

Column 12, line 27, change "GaSa" to --GaAs--.

UNITED STATES PATENT AND TRADEMARK OFFICE
CERTIFICATE OF CORRECTION

PATENT NO. : 4,870,469

DATED : September 26, 1989

INVENTOR(S) : Nishizawa, et al

It is certified that error appears in the above-identified patent and that said Letters Patent is hereby corrected as shown below:

Column 13, line 50, change "nd" to --and--.

Signed and Sealed this

Twenty-sixth Day of February, 1991

Attest:

HARRY F. MANBECK, JR.

Attesting Officer

Commissioner of Patents and Trademarks